(12) United States Patent
Hirai

(10) Patent No.: US 6,887,085 B2
(45) Date of Patent: May 3, 2005

(54) TERMINAL FOR SPIRAL CONTACTOR AND SPIRAL CONTACTOR

(75) Inventor: Yukihiro Hirai, Tokyo (JP)

(73) Assignee: Advanced Systems Japan, Inc., Tokyo (JP)

(*) Notice: Subject to any disclaimer, the term of this patent is extended or adjusted under 35 U.S.C. 154(b) by 0 days.

(21) Appl. No.: 10/481,757

(22) PCT Filed: Jun. 9, 2003

(86) PCT No.: PCT/JP03/07289
§ 371 (c)(1),
(2), (4) Date: Dec. 23, 2003

(87) PCT Pub. No.: WO03/105288
PCT Pub. Date: Dec. 18, 2003

(65) Prior Publication Data
US 2004/0185694 A1 Sep. 23, 2004

(30) Foreign Application Priority Data
Jun. 10, 2002 (JP) .................................. 2002-167999

(51) Int. Cl.⁷ ........................... H01R 12/00; H05K 1/00
(52) U.S. Cl. ........................... 439/82; 439/66; 439/840
(58) Field of Search .................... 439/82, 66, 840, 439/71

(56) References Cited

U.S. PATENT DOCUMENTS

| | | | | |
|---|---|---|---|---|
| 4,961,709 A | * | 10/1990 | Noschese | 439/66 |
| 5,184,962 A | * | 2/1993 | Noschese | 439/66 |
| 5,297,967 A | * | 3/1994 | Baumberger et al. | 439/66 |
| 6,517,362 B2 | * | 2/2003 | Hirai et al. | 439/82 |
| 6,672,876 B1 | * | 1/2004 | Takekoshi | 439/66 |

FOREIGN PATENT DOCUMENTS

| | | |
|---|---|---|
| JP | 2000-123935 | 4/2000 |
| JP | 2002-175859 | 6/2002 |
| WO | 95/34106 | 12/1995 |

* cited by examiner

Primary Examiner—Hae Moon Hyeon
(74) Attorney, Agent, or Firm—Squire, Sanders & Dempsey L.L.P.

(57) ABSTRACT

The present invention relates to a terminal for a spiral contactor performing an electrical connection with an electronic component. The terminal is constituted including a peripheral frame and a contact portion contacting a connection end terminal. One end of the contact portion is fixed on the peripheral frame and the other end of the contact portion is provided spirally extended toward a center of an opening of the peripheral frame so as to universally move in a perpendicular direction for an opening face of the peripheral frame. And a thickness of the contact portion becomes thinner as the contact portion proceeds from one end toward the other end.

6 Claims, 12 Drawing Sheets

TERMINAL FOR SPIRAL CONTACTOR AND SPIRAL CONTACTOR

FIELD OF THE INVENTION

The present invention relates to a terminal for a contactor performing an electrical connection with an electronic component, and in particular, relates to the contactor equipped with a volute (spiral) shape of the terminal performing the electrical connection with a semiconductor device (electronic component) having a spherical connection end terminal and a pad-shaped connection end terminal.

BACKGROUND OF THE INVENTION

Accompanying a multifunction and high performance of a semiconductor integrated circuit in these years, a high density packaging of an IC package mounting an IC chip (hereinafter referred to as semiconductor device or simply semiconductor) is requested. As a result, a BGA (Ball Grid Array) which is comparatively compact and is a spherical connection end terminal possible to be made multi-pin becomes to be used instead of a conventionally used QFP (Quad Flatpack Package) and the like.

This is thanks to a fact that an adoption of the spherical connection end terminal allows a reduction of an attachment area and a placement space of the IC package, and a thickness reduction of the IC package itself.

The trend of the miniaturization is in these years rapidly progressing and the spherical connection end terminal itself tends to be more miniaturized. In fact a pitch of the spherical connection end terminal becomes from 0.5 to 0.3 mm, thereby a further narrow pitch being proceeding.

Under these circumstances a terminal electrically connecting with the spherical connection end terminal is also requested to handle the miniaturization and high integration.

In advance, the applicant of the present invention disclosed in Japanese patent application 2001-077338 (applied in Mar. 19, 2001) a spiral contactor in which a terminal contacting a spherical connection end terminal has a spiral shape, and a width of the terminal becomes narrower as the terminal proceeds from a base end side to a top side.

FIG. 11A is a plan view in which a part of a spiral contactor 30 disclosed in the application is represented partially enlarged; FIG. 11B is a section drawing of a line F—F shown in FIG. 11A.

As shown in FIG. 11A, the spiral contactor 30 is constituted of a plurality of spiral-shaped terminals 31 (hereinafter referred to as spiral-shaped terminals) disposed like a lattice on a board (hereinafter referred to as insulation board) composed of insulation materials.

Each spiral-shaped terminal 31 has a circular shape and is arranged in a separated state from adjacent spiral-shaped terminals 31 at a predetermined distance in longitudinal and lateral directions.

A disposition of each spiral-shaped terminal 31 of the spiral contactor 30 is set so that when the spiral contactor 30 is used as a contactor to perform an electrical connection with an electronic component, it can one for one overlap a spherical connection end terminal disposed at a semiconductor device like a lattice.

In the spiral contactor 30 shown in the drawings, considering a diameter of the spherical connection end terminal disposed at the semiconductor device, distances p1 from a center of a spiral-shaped terminal 31 till those of adjacent spiral-shaped terminals 31 are set.

In the spiral-shaped terminal 31 is formed a spiral (volute) form probe 32, and at its center portion is ensured an approximately circular space with a diameter h.

A length of the probe 32 is set so that a contact length of the probe 32 and spherical connection end terminal becomes not less than one rotation (accurately one and one fourth rotations) when contacting the spherical connection end terminal.

That is, the length of the probe 32 is set to be a length which can keep an electrical connection surely contacting the spherical connection end terminal when the probe 32 and spherical connection end terminal are contacted.

In addition, as shown in FIG. 11A, a width size in each point a to f of the probe 32 is designed to be a shape in which a relationship of a>b>c>d>e>f is realized. That is, the width of the probe 32 is set to become narrower as the probe 32 nears its top.

However, in the spiral terminal 30 equipped with the spiral-shaped end terminal 31, the width of the probe 32 becomes broader as the probe 32 nears from its top E to base end R, so if the spiral contactor 30 is constituted by the spiral-shaped terminals 31 being arranged at a narrow pitch in order to handle the miniaturization of the spherical connection end terminal of the semiconductor device, a wound number of the probe 32 (contact length of the probe 32 and spherical connection end terminal) cannot be made more, thereby the wound number of the probe 32 resulting in being decreased.

FIG. 12A is a partially enlarged plan view of a spiral contactor 40 in which a disposition distance of spiral-shaped terminals 41 is set at a narrower pitch; FIG. 12B is a section drawing of a line G—G shown in FIG. 12A.

That is, as shown in FIG. 12A, because in the spiral contactor 40 a width W of the probe 42 becomes narrower as the probe 42 proceeds from its base end R to top E, a contact length of the probe 42 and spherical connection end terminal becomes not more than one rotation (accurately three fourths rotation), thereby there existing a problem that a sufficient contact with the spherical connection end terminal is not ensured.

In addition, when a thorough hole (concave portion) making it possible to be pushed in by the spherical connection end terminal is not provided on an insulation board to make it ultra-thin, there exists a program that a spiral contactor cannot be adopted as the insulation board.

Under these circumstances, there exists a request for a contactor which can use even a semiconductor device and microminiature pair chip in which a disposition distance of the spherical connection end terminal is narrower pitched, and which can sufficiently ensure a contact length (at least a contact length not less than one rotation) with the spherical connection end terminal.

Moreover, there also exists a request for a contactor which can adopt even an insulation board in which a thorough hole is not provided.

DISCLOSURE OF THE INVENTION

The present invention relates to a terminal for a spiral contactor performing an electrical connection with a connection end terminal provided in an electronic component. The terminal is constituted including a peripheral frame and contact portion contacting the connection end terminal of the electronic component.

One end of the contact portion is fixed on the peripheral frame and the other end of the contact portion is provided spirally extended toward a center of an opening of the peripheral frame so as to be universally movable in a perpendicular direction for an opening face of the peripheral frame. And a thickness of the contact portion is set so as to become thinner as the contact portion proceeds from one end to the other.

The terminal for the spiral contactor with such the constitution enables the wound number of the contact portion spirally extended toward the center of the opening of the peripheral frame to be increased because the contact portion of the terminal is designed to be constant in width in accordance with that of a top and to become thinner in thickness as the contact portion nears from one end to the other. As a result, the length of the contact portion contacting the spherical connection end terminal can be sufficiently ensured. Moreover, by gradually strengthening a toughness of a volute portion as the contact portion proceeds to one end side with the thickness of the contact portion being gradually thickened, a terminal with a long life, in which a contact with the spherical connection end terminal is sufficiently ensured, a bending stress is dispersed like a fishing rod, and a flexibility is exerted, and which is durable, is provided.

Moreover, the invention relates to a spiral contactor in which the terminal for the spiral contactor described before is equipped in a board.

In the spiral contactor, the terminal is embedded in the board so that a contact portion becomes same in level with a surface of the board, and in the board a concave portion tolerating an inward movement of the contact portion is provided.

The spiral contactor with such the constitution allows a thickness of the spiral contactor to be made thinner because the terminal is embedded in the board so that the contact portion becomes same in level with the surface of the board.

Moreover, because these terminals can be plurally provided on boards in an accurate and minuscule size by photolithography technology, they can favorably handle various kinds of connection end terminals of microdevices in which microminiaturizing and ultra-thinning are proceeding.

BRIEF DESCRIPTION OF THE DRAWINGS

FIGS. 8A to 8C are drawings showing a case in which spiral-shaped terminals related to the invention are utilized as switches of an electronic component and the like: FIG. 8A is a plan view of switches with a constitution of parallelly moving connection end terminals; FIG. 8B is an enlarged section drawing of a line H—H; and FIG. 8C is a plan view of switches with a constitution of rotationally moving connection end terminals around a fulcrum.

FIG. 12A is an enlarged drawing disposed at a narrower pitch; and FIG. 12B is a section drawing of a line G—G shown in FIG. 12A.

DESCRIPTION OF THE MOST PREFERRED EMBODIMENTS

Figures 1A, 1B:
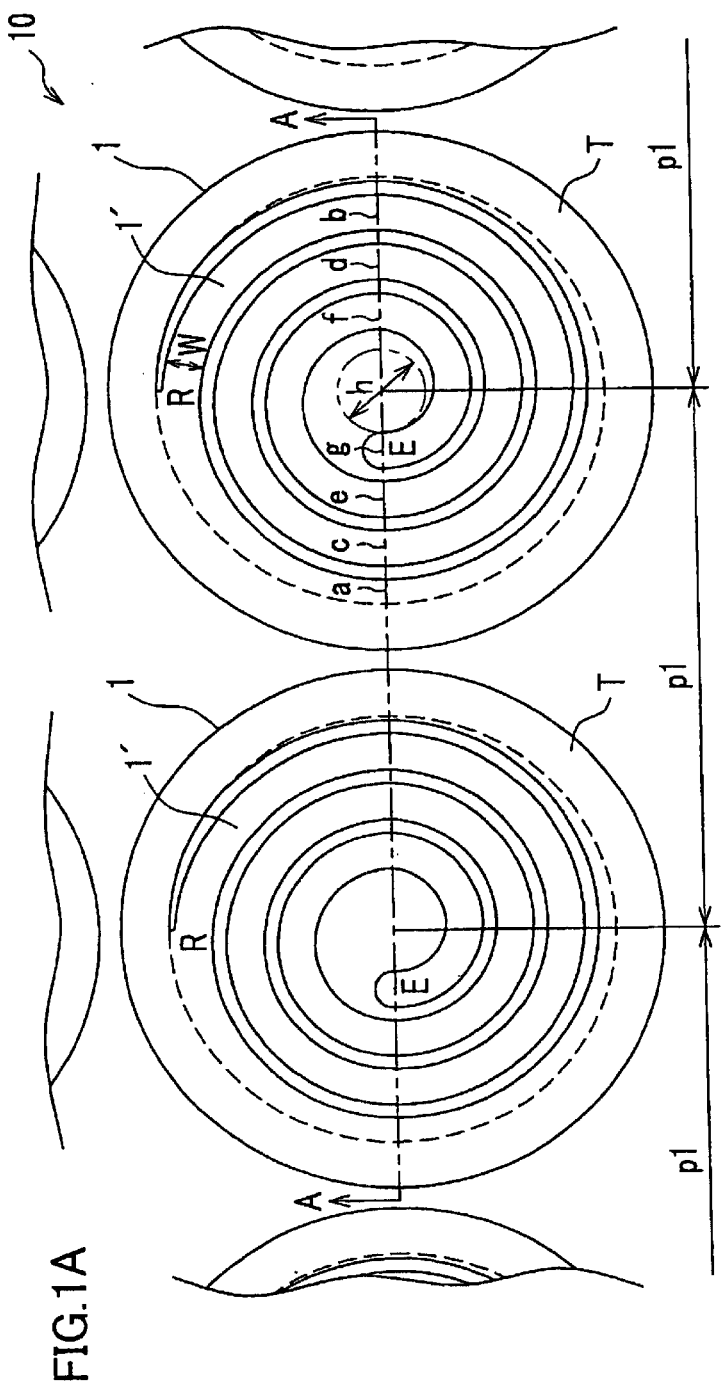
FIG. 1A is an enlarged plan view of a spiral contactor being a first embodiment of the present invention.
FIG. 1B is a section drawing of a line A—A shown in FIG. 1A.

Hereinafter, the preferred embodiments of the present invention will be described in detail, referring to the drawings as needed.

[First Embodiment]
Spiral Contactor 10

A spiral contactor related to the invention is a contactor to perform a electrical connection a semiconductor device with a spherical connection end terminal and a pad-shaped connection end terminal, and an electronic component.

As shown in FIG. 1A, a spiral contactor 10 is constituted of a plurality of spiral-shaped terminals 1 disposed like a lattice on a board (insulation board).

A disposition of the spiral-shaped terminals 1 is set in accordance with that of spherical connection end terminals disposed at a back face of a semiconductor device like a lattice and is constituted so that the spherical connection end terminal and spiral-shaped terminal 1 can be electrically connected with the semiconductor device by overlapping one for one.

Here, in the spiral contactor 10 of the embodiment a pitch p1 between the spiral-shaped terminals 1 is set to be 0.4 mm.

The spiral-shaped terminal 1 is constituted including a peripheral frame T and contact portion 1'.

The peripheral frame T has a circular shape in a plan view and in the frame T is provided the contact portion 1' extending toward a center of the frame T so as to have a spiral shape in a plan view.

The contact portion 1' has a base end R fixed on the frame T and a top E not fixed on the frame T, and a width W of the contact portion 1' is set to be same from the base end R till top E.

In addition, as shown in FIG. 1B, a thickness of the contact portion 1' is set to becomes thinner as the contact portion 1' proceeds from the base end R toward top E. That is, the contact portion 1' is set to be a shape in which a thickness in each point a to g satisfies a>b>c>d>e>f>g.

Here, reasons why the thickness of the contact portion 1' is set to become thinner as the contact portion 1' proceeds from the base end R toward top E are to ensure a contact length with the spherical connection end terminal by increasing a wound number at the spiral-shaped contact portion 1'; to make a durable contact portion exerting a flexibility while dispersing a bending stress like a fishing rod, by gradually weakening a toughness of the contact portion 1' itself with gradually thinning the thickness; and the like. Meanwhile, in a push-in test using a spherical connection end terminal, the contact portion 1' has substantiated a durability of two hundred thousands times.

A length of the contact portion 1' from the base end R till top E is set to be a length in which the contact length (contact total length) of the contact portion 1' and a surface of the spherical connection end terminal is ensured at least two and three fourths rotations of the spherical connection end terminal when the contact portion 1' and spherical connection end terminal are contacted.

The spiral-shaped terminal 1 equipped with the contact portion 1' is embedded in an insulation board 6 in a state where the peripheral frame T is fixed around the board 6. In this case, surfaces of the contact portion 1' and board 6 are set to become same in level.

Here, because the top E of the contact portion 1' is not fixed, a side of the top E is removable in a perpendicular direction for a face of an opening of the peripheral frame T. Thus, the side of the top E of the contact portion 1' of the spiral-shaped terminal 1 embedded in the insulation board 6 is movable in up/down directions for the surface of the board 6.

Meanwhile, at a center portion of the spiral-shaped terminal 1 is provided an approximately circular space to evade a contact with the center portion of the spherical connection end terminal.

This is according to following reasons:

1. When the spiral-shaped terminal 1 and spherical connection end terminal are contacted, make the contact portion 1' embracingly contact the spherical connection end terminal t.
2. Make the contact portion 1' wind to the spiral-shaped terminal 1, thereby making an edge EG of the portion 1' surely contact the spherical connection end terminal.

Such the embracing contact of the edge EG of the contact portion 1' with the spherical connection end terminal like this enables an oxide film formed on a surface of the spherical connection end terminal to be removed because when the spherical connection end terminal pushes the spiral-shaped terminal 1, the edge EG of the contact portion 1' abrades the surface of the spherical connection end terminal. Moreover, by the edge EG of the contact portion 1' surely contacting the spherical connection end terminal, a reliability of an electrical connection with an electronic component can be heightened.

Figure 2A:
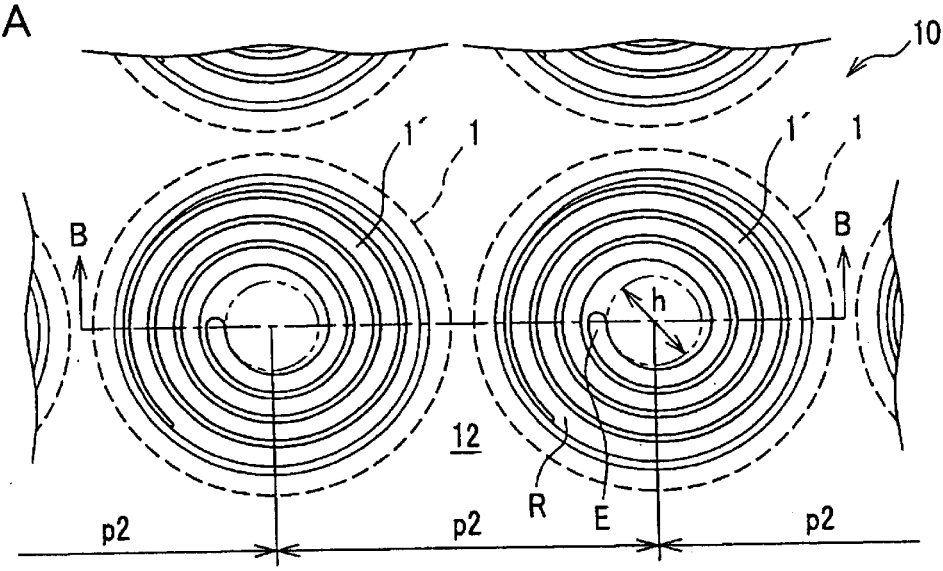
FIG. 2A is a plan view showing another example of the spiral contactor shown in FIG. 1.

In a spiral contactor 10 shown in FIG. 2A are provided guide frames 12 on insulation boards 6 and spiral-shaped terminals 1.

The guide frame 12 is provided to restrict a move amount in up/down directions when a spherical connection end terminal 7 provided on a semiconductor device 8 contacts the spiral-shaped terminal 1 and a contact portion 1' moves in the up/down directions pushed in a downward direction for the insulation board 6.

Subsequently, movements of the spiral contactor 10 with such the constitution are described below.

Figure 2B:
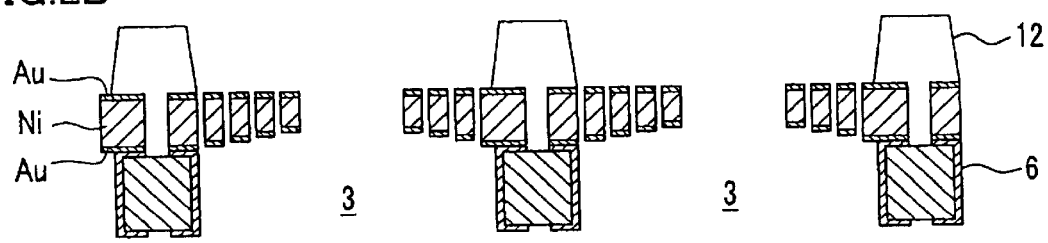
FIG. 2B is a section drawing of a line B—B shown in FIG. 2A.
Figure 2C:
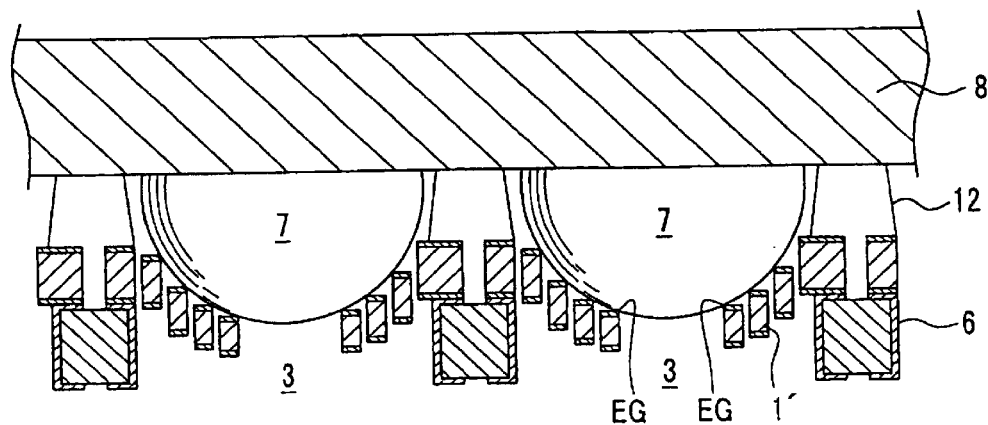
FIG. 2C is a section drawing showing an appearance in which a spherical connection end terminal of a semiconductor device pushes a spiral-shaped terminal.

As shown in FIG. 2C, when the spherical connection end terminal 7 of the semiconductor device 8 contacts the spiral-shaped terminal 1 and the contact portion 1' is pushed in the downward direction, a side of a top E of the contact portion 1' moves in the downward direction for the insulation board 6 because it is not fixed. Then because the spherical connection end terminal 7 sequentially contacts from a center side to outside, the contact portion 1' concavely bends and is deformed like embracing the spherical connection end terminal 7.

Because when the contact portion 1' is deformed, the edge EG of the contact portion 1' abrades the surface of the spherical connection end terminal 7, even in cases that an oxide film is formed on the surface of the end terminal 7 and dirt is adhered, these are surely removed by the contact portion 1'. As a result, a surface condition of the spherical connection end terminal 7 is kept, so the electrical contact of the end terminal 7 and spiral contactor 10 becomes to be more surely performed.

Meanwhile, in the embodiment, as shown in FIG. 2B, in the contact portion 1' is formed a metal layer (gold plating layer) consisting of gold on upper/lower surfaces of a nickel layer. Providing the metal layer on the upper/lower surfaces of the nickel layer enables the oxide film formed on the surface of the spherical connection end terminal 7 to be surely removed by raising when a edge EG of the metal layer abrades the surface of the end terminal 7 because the edge EG formed by a plating 2 is raised.

Moreover, an existence of the metal layer enables an occurrence of rust on the contact surface of the spiral-shaped terminal 1 with the spherical connection end terminal 7 to be prevented.

Manufacturing Method of Spiral Contactor 10

Next, a manufacturing method for forming the spiral-shaped terminal 1 of the embodiment on the insulation board 6 will be described in detail.

Figure 3:
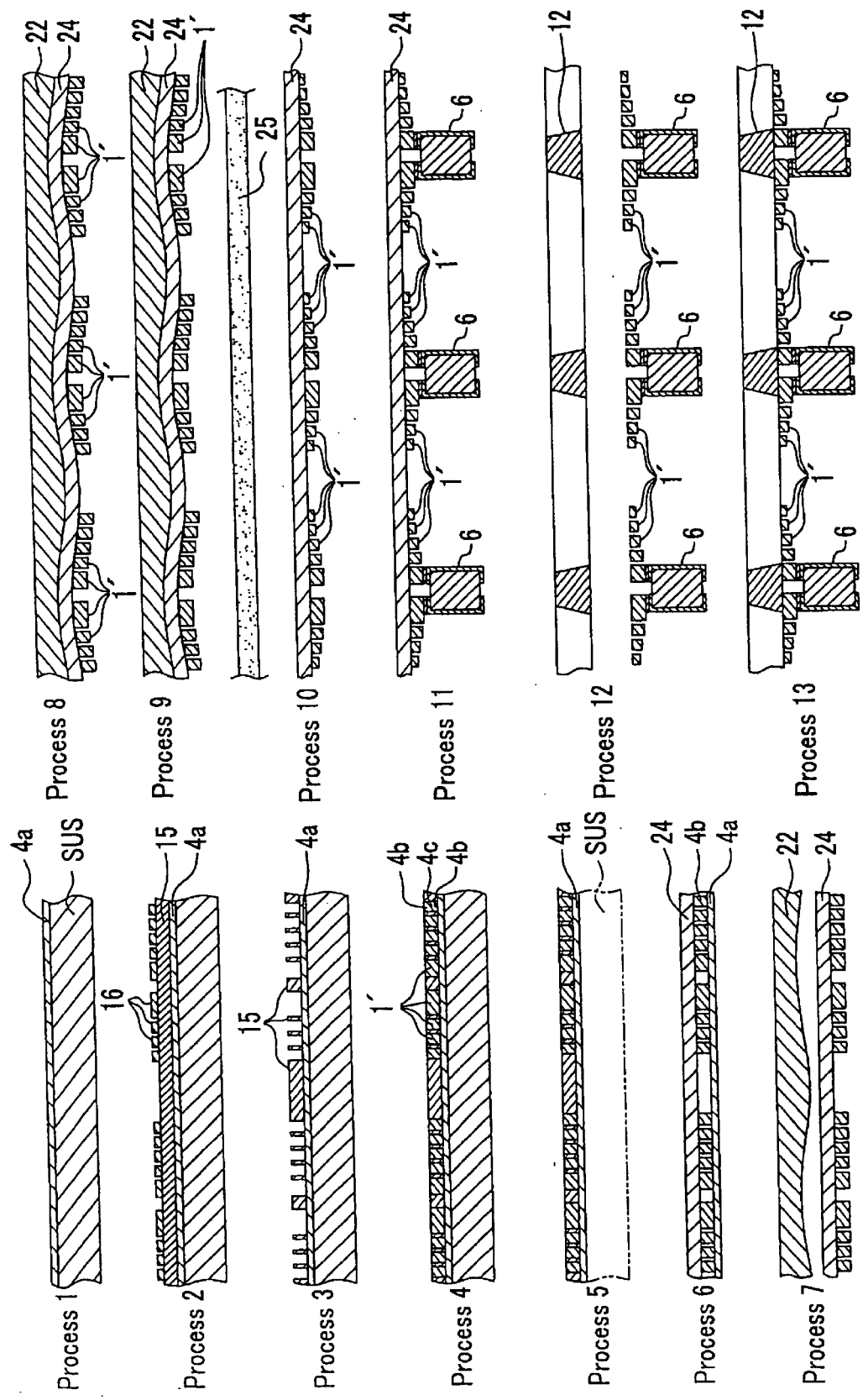
FIG. 3 is a process drawing to illustrate a manufacturing method of the spiral contactor being the first embodiment of the invention.

FIG. 3 is a process drawing to illustrate a manufacturing process of the first embodiment of the invention.

Firstly, form a metal film (copper plating) 4a on a surface of a metal sheet such as SUS (stainless steel) (process 1), coat a photoresist film 15 on the metal film, and then dispose a photomask 16 with a pattern of the spiral-shaped terminal 1 (process 2).

Subsequently, after exposing the photoresist film 15, perform a development treatment, and remove excess photoresist film 15 (process 3).

And provide plating layers in order of a gold plating layer 4b, nickel plating layer 4c, and gold plating layer 4b on the metal film (copper plating) 4a exposed within the photoresist film 15, thereby forming the contact portion 1' (process 4).

A reason why the gold layers are thus provided on the upper/lower surfaces of the nickel layer is as described before to prevent rust from occurring on the contact surface of the spiral-shaped terminal 1 with the spherical connection end terminal 7. In addition, a reason why the spiral-shaped terminal 1 is mainly composed of nickel is that nickel is superior in a spring property and is also durable, thereby a durability of the contact portion 1' of the spiral-shaped terminal 1 becoming better.

Meanwhile, although in the embodiment gold is used to prevent rust from occurring at the contact portion 1', other metals may be used if they are difficult to be oxidized and are superior in conductivity. For example, as such the material, beryllium copper (BeCu) can be favorably used.

Subsequently, remove the metal sheet of SUS (stainless steel) (process 5), remove the photoresist film 15, thereby making the spiral-shaped terminals 1, and then paste a carrier tape 24 on an upper surface of the gold plating 4b (process 6).

Then remove the metal film (copper plating) 4a by etching, and paste the spiral-shaped terminals 1 with the carrier tape 24 on a pallet 22 where a plurality of convex portions are formed on one surface in accordance with a largeness of the terminals 1 (process 7).

Suck the carrier tape 24 by vacuum which pasted the spiral-shaped terminals 1 on the convex portions of the pallet 22 (process 8).

Subsequently, after removing protuberant portions because of the convex portions of the pallet 22 of the spiral-shaped terminals 1 by grinding with a grinding stone 25 (process 9), remove the pallet 22 (process 10).

Then prepare the insulation boards 6 treated with a conductive adhesive and soldering, and paste the spiral-shaped terminals 1 on the boards 6 (process 11).

Subsequently, after removing the carrier tape 24 by radiating UV light (ultra violet ray) on the tape 24 (process 12), place the guide frames 12 on the spiral-shaped terminals 1 (process 13).

The process procedures described above enables the spiral contactor 10 consisting of the spiral-shaped terminals 1 with the contact portions 1' of which thickness becomes thinner as the contact portions 1' proceed from the base ends R to tops E to be manufactured.

In addition, by utilizing a cover lay treatment which performs exposure/development treatments for a resist film, a photolithography technology such as an etching, and a plating manufacturing technology, an accurate minuscule processing is possible.

Meanwhile, in the processes 12 and 13 without removing the carrier tape 24 and after pasting the guide frames 12 on the tape 24 as it is, it is also possible to form holes in the tape 24. In addition, a manufacturing of the spiral-shaped terminals 1 is also possible by utilizing an electron beam machining and other minuscule machinings, and a configuration in which these are added to the processes described above may be available.

[Second Embodiment]
Spiral Contactor 20

Figure 4A:
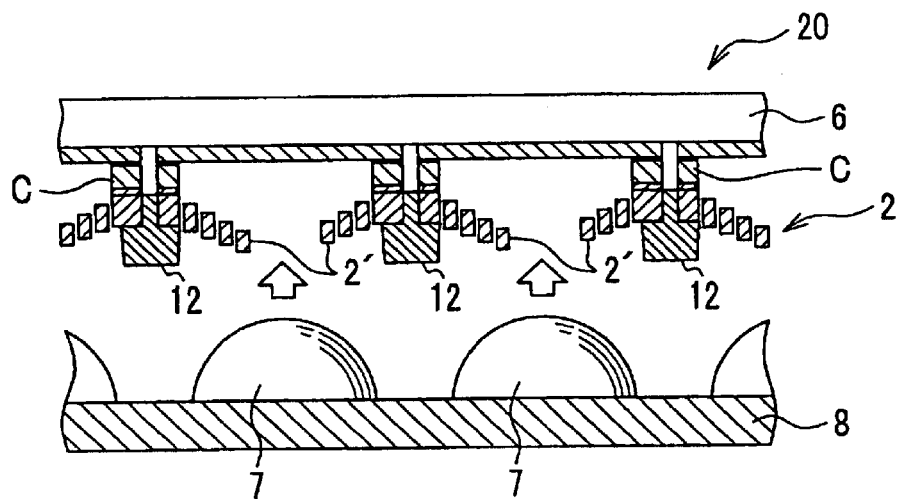
FIG. 4A is a section drawing showing an appearance in which a spherical connection end terminal is neared to a spiral-shaped terminal of a spiral contactor placed on a board where a through hole is not provided.
Figure 4B:
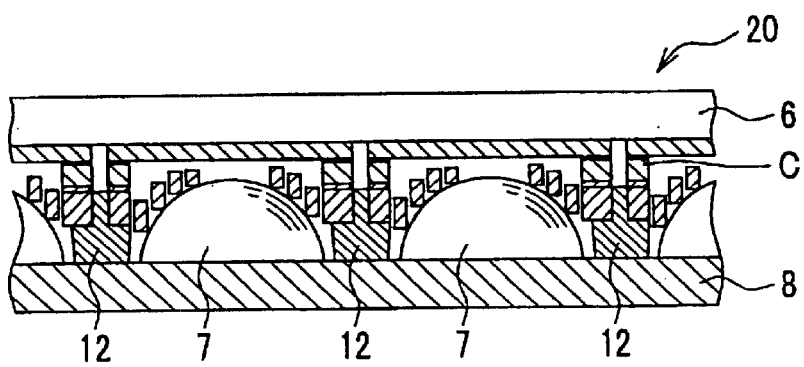
FIG. 4B is a section drawing showing an appearance in which the spherical connection end terminal is connected with the spiral-shaped terminal. In addition.
Figure 4C:
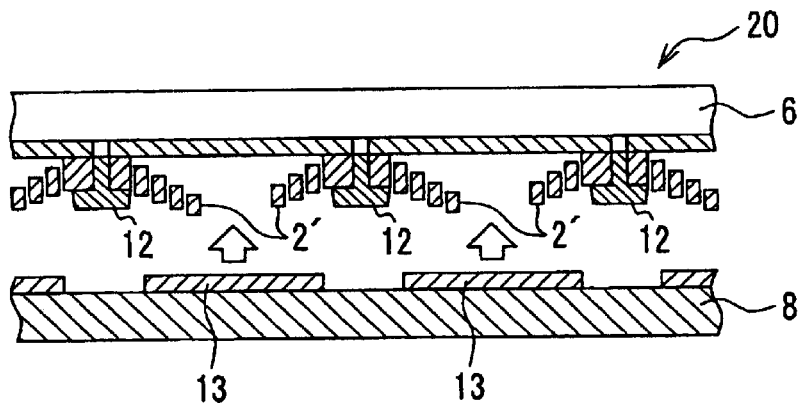
FIG. 4C is a section drawing showing a pad-shaped connection end terminal instead of the spherical connection end terminal.

FIGS. 4A to 4C are illustration drawings showing a second embodiment of the invention: FIG. 4A is a section drawing showing an appearance in which spherical connection end terminals 7 are neared to spiral-shaped terminals 2 provided on an insulation board 6 where no through hole exists; and FIG. 4B is a section drawing showing an appearance in which the spherical connection end terminals 7 are connected with the spiral-shaped terminals 2.

As shown in FIG. 4A, the insulation board 6 has no through hole, and on a surface of the board 6 are disposed the spiral-shaped terminals 2 in which contact portions 2' are provided so as to be distendedly positioned in a opposite direction to the board 6.

The spiral-shaped terminals 2 are provided elevated from the insulation board 6 by pedestals C to ensure a space tolerating deformations of the contact portions 2' when the portions 2' are moved to a side of insulation board 6 by the spiral-shaped terminals 2 being pushed with the spherical connection end terminals 7. Because the spiral contactor 20 of the embodiment thus unifiedly forms the pedestals C and spiral-shaped terminals 2, a space tolerating the deformations of the contact portions 2' is ensured between insulation board 6 and spiral-shaped terminals 2. Consequently, the spiral contactor 20 related to the invention can favorably adopt even the insulation board 6 in which no through hole is provided.

In addition, on peripheral frames of the spiral-shaped terminals 2 are provided guide frames 12. The guide frames 12 are used for a positioning in contacting the spherical connection end terminals 7 with the spiral-shaped terminals 2 and a guidance of the end terminals 7 to terminals 2.

Moreover, because the guide frames 12 abut with a semiconductor device 8 as shown in FIG. 4B, a move amount is regulated when the spiral-shaped terminals 2 move to the side of the insulation board 6 by being pushed with the spherical connection end terminals 7, and a uniform contact without a deviation to the terminals 2 of the end terminals 7 is ensured.

FIG. 4C is a drawing illustrating a case of the semiconductor device 8 in which pad-shaped connection end terminals 13 are used instead of the spherical connection end terminals 7.

Figure 4D:
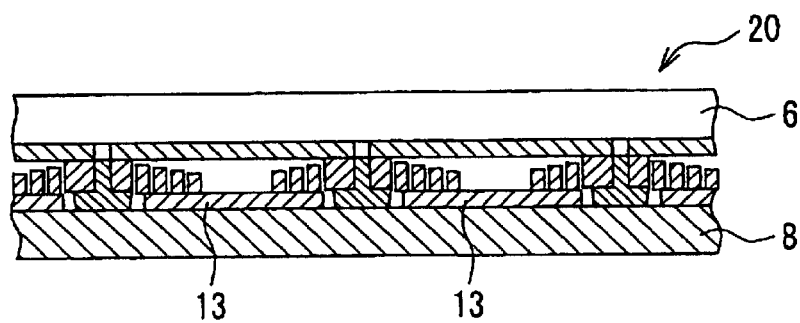
FIG. 4D is a section drawing showing an appearance in which the pad-shaped connection end terminal is connected with the spherical connection end terminal of the spiral contactor.

FIG. 4D is a drawing showing a state in which the semiconductor device 8 using the pad-shaped connection end terminals 13 and the spiral contactor 20 are contacted.

Similarly also in this case, a move amount is designed to be regulated when the spiral-shaped terminals 2 move to the side of the insulation board 6 being pushed with the pad-shaped connection end terminals 13 by the semiconductor device 8 abutting with the guide frames 12, and a contact between the terminals 2 and end terminals 13 is designed to be sufficiently ensured.

Thus, by using the pad-shaped connection end terminals 13 instead of the spherical connection end terminals 7, the pedestals C can be omitted, so a height of the guide frames 12 can be lowered, thereby a thickness of the spiral contactor 20 being able to be made thinner. Moreover, by using the pad-shaped connection end terminals 13 instead of the spherical connection end terminals 7, a thickness of the semiconductor device 8 with the end terminals 13 can also be thinned, so a further thinning of the device 8 becomes possible.

Manufacturing Method of Spiral Contactor 20

Figure 5:
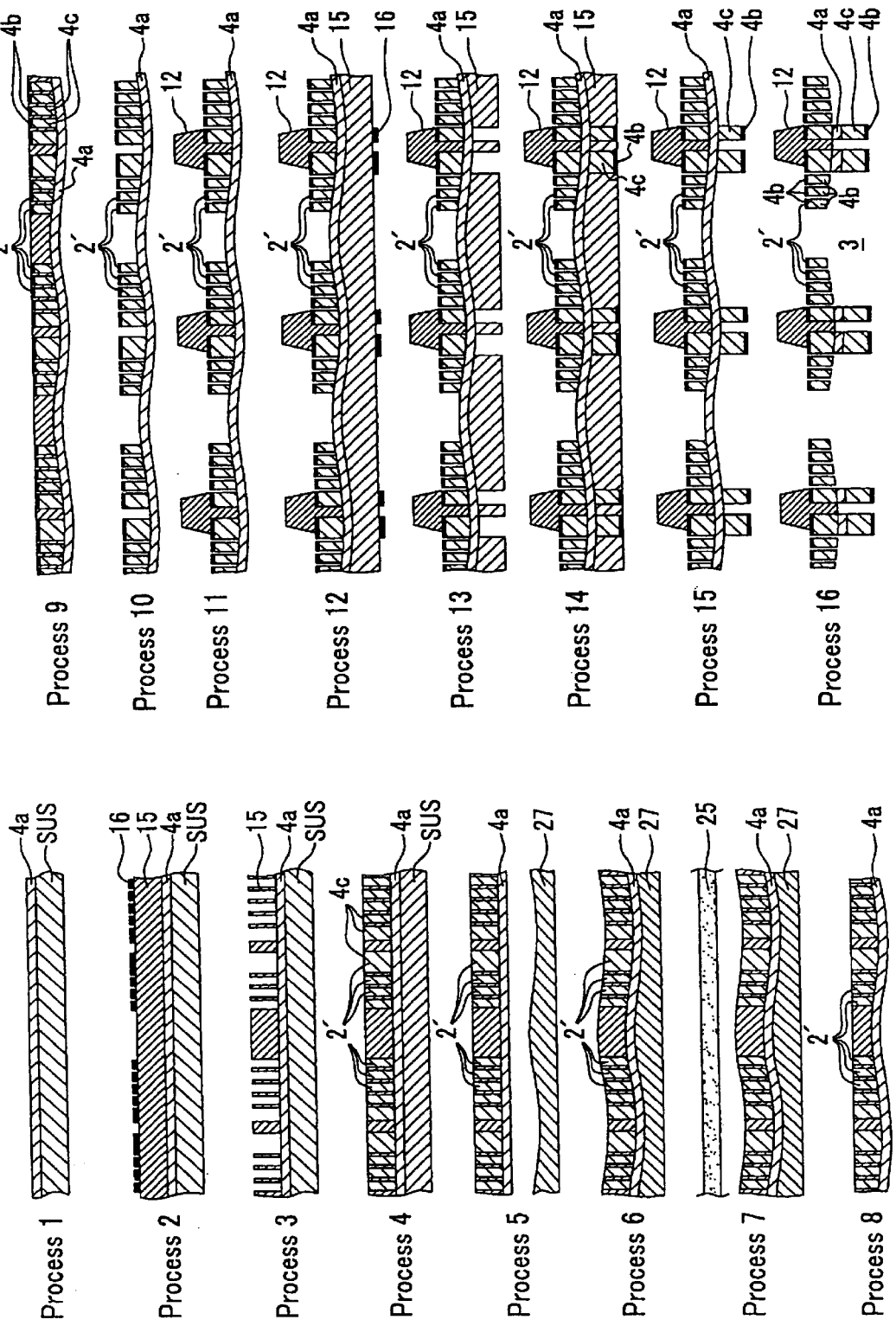
FIG. 5 is a drawing of a former half of processes to illustrate a manufacturing method of a spiral contactor being a second embodiment of the invention.
Figure 6:
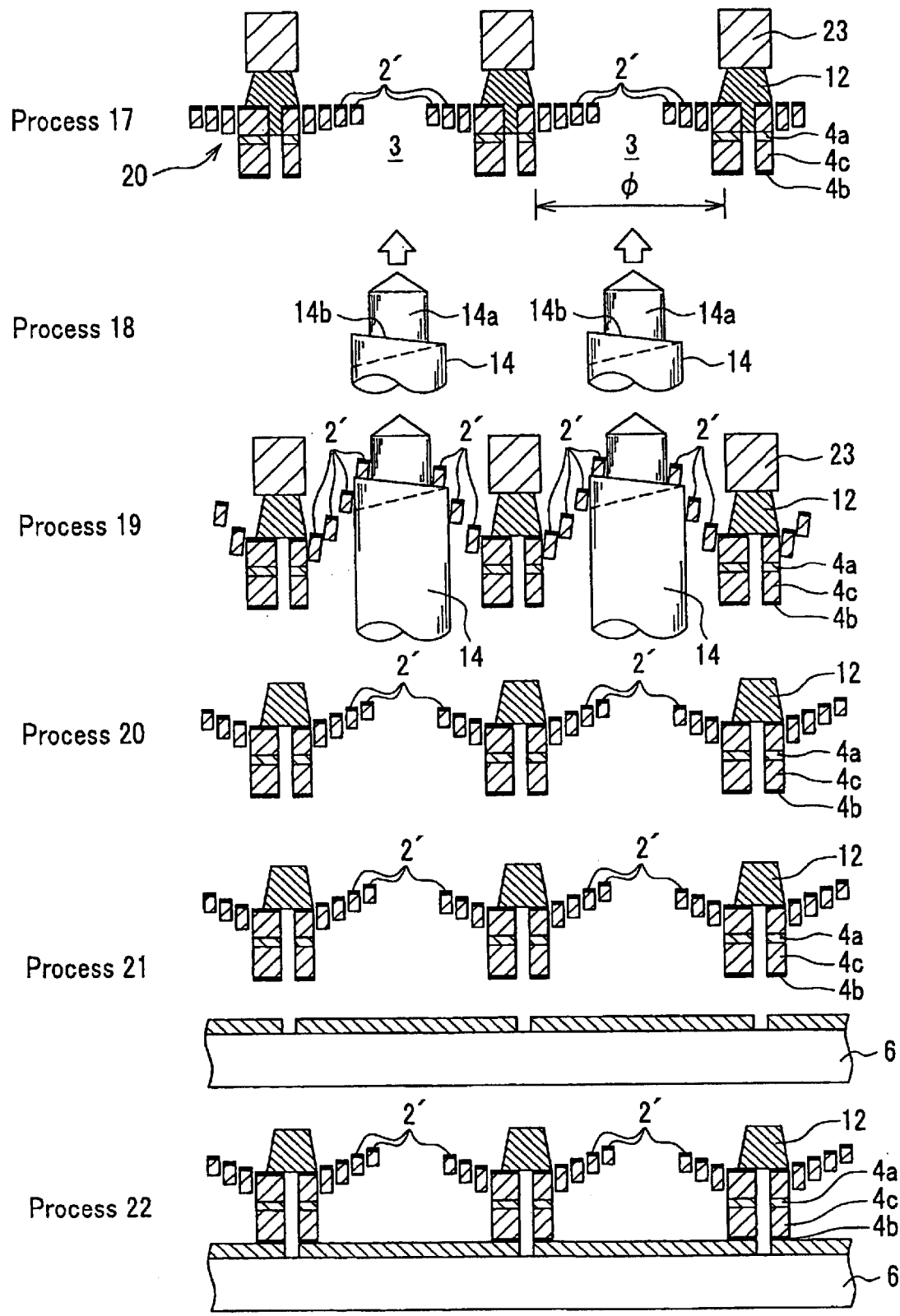
FIG. 6 is a drawing of a latter half of the processes to illustrate the manufacturing method of the spiral contactor being the second embodiment of the invention.

FIGS. 5 and 6 are process drawings illustrating a manufacturing method of a spiral contactor 20 of the second embodiment of the invention.

Firstly, form a metal film (copper plating) 4a on a surface of a SUS (stainless steel) metal sheet, for example, with a thickness of 20 to 60 $\mu$m (process 1), coat a photoresist film 15 on the metal film 4a, and then dispose photomasks 16 with a pattern of the spiral-shaped terminals 2 on the film 15 (process 2).

Subsequently, after exposing the photoresist film 15, perform a development treatment, and remove excess photoresist film 15 (process 3).

And dispense, for example, a nickel (Ni) plating layer 4c on the metal film (copper plating) 4a exposed within the photoresist film 15, thereby forming the spiral-shaped terminals 2 (process 4).

Here, it is also possible to make the plating treatment, as in the last described embodiment, constituted so that the plating layers are provided in order of a gold plating layer 4b, nickel plating layer 4c, and gold plating layer 4b on the metal film (copper plating) 4a.

Subsequently, remove the SUS metal sheet (process 5); on a side where the SUS was provided, prepare a pallet 27 where a plurality of convex portions are formed on one surface in accordance with a largeness of the spiral-shaped terminals 2; and abut with the terminals 2 on convex portions of the pallet 27 by vacuum sucking, thereby shaping the terminals 2 convex (processes 6 and 7).

Here, a material of a pallet may be the SUS (stainless steel) and other metals.

Then, after removing protuberant portions because of the convex portions of the pallet 27 of the spiral-shaped terminals 2 by grinding with a grinding stone 25, remove the pallet 27 (process 8).

And dispense a gold plating 4b on a ground surface of the spiral-shaped terminals 2 (process 9).

Subsequently, remove the photoresist film (dry film) 15 (process 10), attach the guide frames 12 of a polyimide film, in which a drilling processing is dispensed, by heat-pressing (process 11).

Then, coat the photoresist film 15 on a lower surface of the metal surface of the copper plating 4a, dispose the photomasks 16 (process 12), expose the film 15 (process 13), then perform a development treatment, and remove excess film 15.

And after providing plating layers in order of a nickel plating layer 4c and a gold plating layer 4b on the copper plating 4a exposed within the photoresist film 15 (process 14), remove the film 15 (process 15).

Subsequently, remove an exposed metal film (copper plating) 4a by etching (process 16).

Next, as shown in FIG. 6, in order to prevent a shape of the spiral-shaped terminals 2 from being deformed, paste pallets 23 on upper surfaces of the guide frames 12 as a reinforcement member (process 17).

And prepare convex tools 14 in which axle tree portions 14a for positioning at centers and spiral shoulder portions 14b of one rotation around peripheries of the axle tree portions 14a are provided (process 18).

Meanwhile, the convex tools 14 may be one and be a tool into which a plurality of tools are unified depending on a number and disposition of the spiral-shaped terminals 2 formed on the insulation board 6.

Subsequently, push the spiral-shaped terminals 2 toward the pallets 23 by the convex tools 14, thereby performing a plastic processing of the terminals 2 (process 19). Here, a push amount by the convex tools 14 may be 2 to 2.5 times of a through hole 3, assuming that a diameter $\phi$ of the hole 3 is one.

Draw out the convex tools 14 from the spiral-shaped terminals 2 and remove the pallets 23 (process 20).

Coat a solder reflow and a conductive adhesive on the insulation board 6 where no through hole is provided (process 21), and adhere the spiral-shaped terminals 2 of the spiral contactor 20 to the insulation board 6 by the solder reflow and the conductive adhesive (process 22)

The process procedures described above enables the spiral contactor 20 with the spiral-shaped terminals 2 distended toward a direction to opposite the insulation board 6 to be formed on the insulation board 6 where no through hole is provided.

Meanwhile, after forming different kind metals of which property is different on the exposed copper plating 4a shown in the fourth process instead of the convex tools 14 shown in the 18th process, remove the copper plating 4a by etching, whereby it is also possible to be constituted so that the spiral contactor 20 with the spiral-shaped terminals 2 distended toward the opposite direction to the insulation board 6 is formed thanks to a bimetal effect of the different metals.

[Third Embodiment]

Figure 7A:
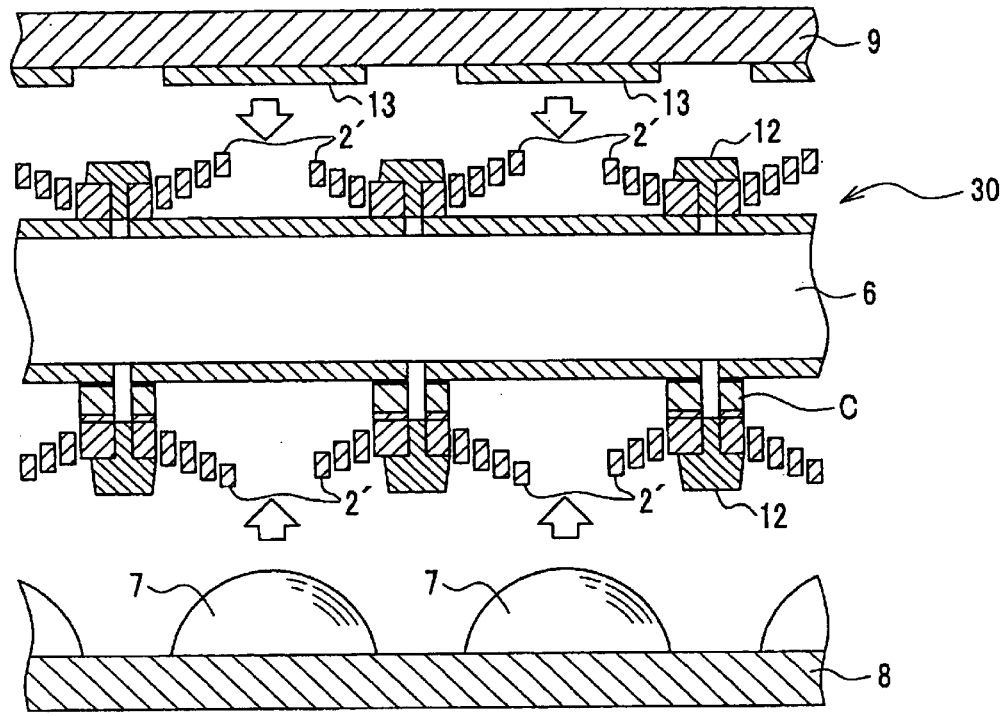
FIG. 7A is a section drawing showing an appearance in which a semiconductor device with a pad-shaped connection end terminal and a semiconductor device with a spherical connection end terminal are neared to a spiral contactor where spiral-shaped terminals are provided on both sides of a board.
Figure 7B:
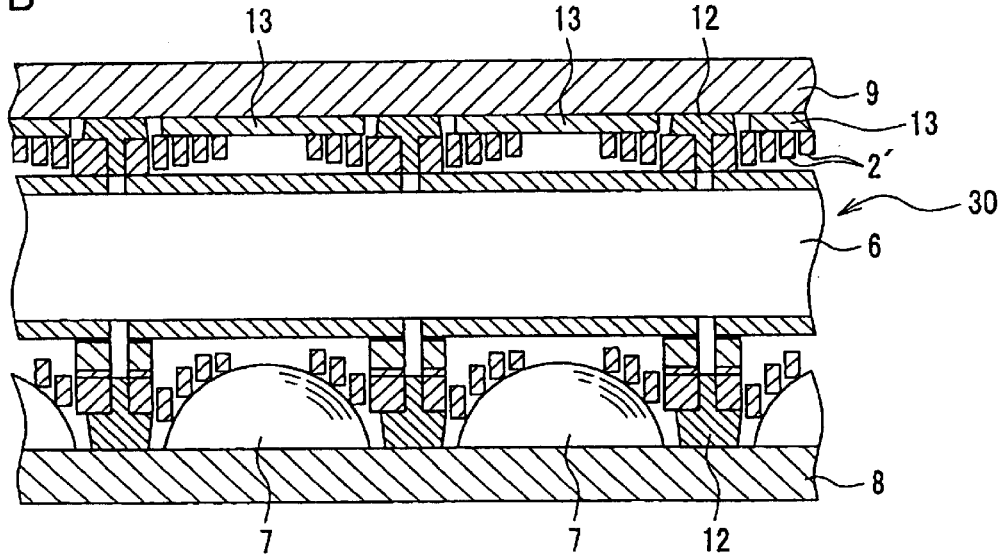
FIG. 7B is a section drawing showing an appearance in which the spherical connection end terminal and pad-shaped connection end terminal are connected with the spiral contactor.

FIGS. 7A and 7B are drawings showing a spiral contactor 30 in which the spiral-shaped terminals 2 described before are provided on both surfaces of an insulation board 6.

In FIG. 7A is shown a case that connection end terminals of a semiconductor device 8 of an inspected objective are spherical connection end terminals 7 and those of a semiconductor device 9 connected with a semiconductor inspection apparatus are pad-shaped connection end terminals 13.

Because the semiconductor device 9 is connected with the semiconductor inspection apparatus not shown in the drawings, it can perform an inspection of such a wiring condition of the inspected objective by connecting the inspected objective and inspection apparatus through the spiral contactor 30.

The spiral-shaped terminals 2 shown in FIGS. 7A and 7B are same in shape and only a thickness of guide frames 12 is different.

In addition, although in FIGS. 7A and 7B the case that connection end terminals of the semiconductor device 8 of the inspected objective are the spherical connection end terminals 7 and those of the semiconductor device 9 are the pad-shaped connection end terminals 13 is shown, a selection of connection end terminals such as a case that the connection end terminals of the semiconductor device 8 and semiconductor device 9 are both spherical connection end terminals and another case that those are both pad-shaped connection end terminals 13 is changeable as needed.

As described above, because a constitution where the spiral contactor 30 related to the invention is provided on the both surfaces of the insulation board 6 enables a thickness of a contactor itself to be made more thinner, an adoption of the contactor with such the constitution allows a semiconductor inspection apparatus itself to be miniaturized. In addition, because the spiral contactor 30 related to the invention is equipped with excellent connection characteristics, the adoption of the contactor with such the constitution as a contactor of the semiconductor inspection apparatus of a semiconductor device allows an inspection accuracy of the semiconductor inspection apparatus to be improved.

[Fourth Embodiment]

Figure 8A:
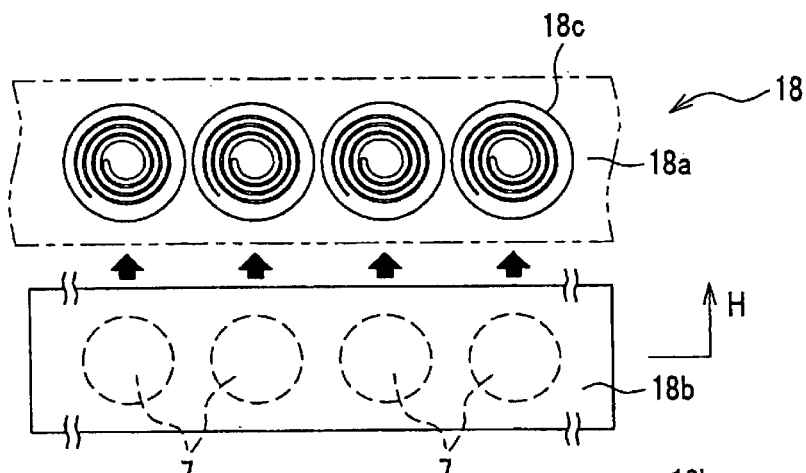
Figure 8B:
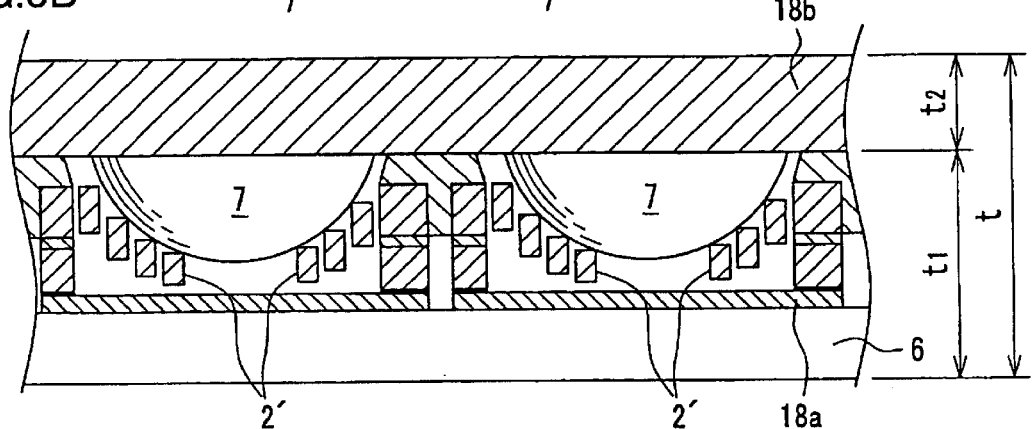
Figure 8C:
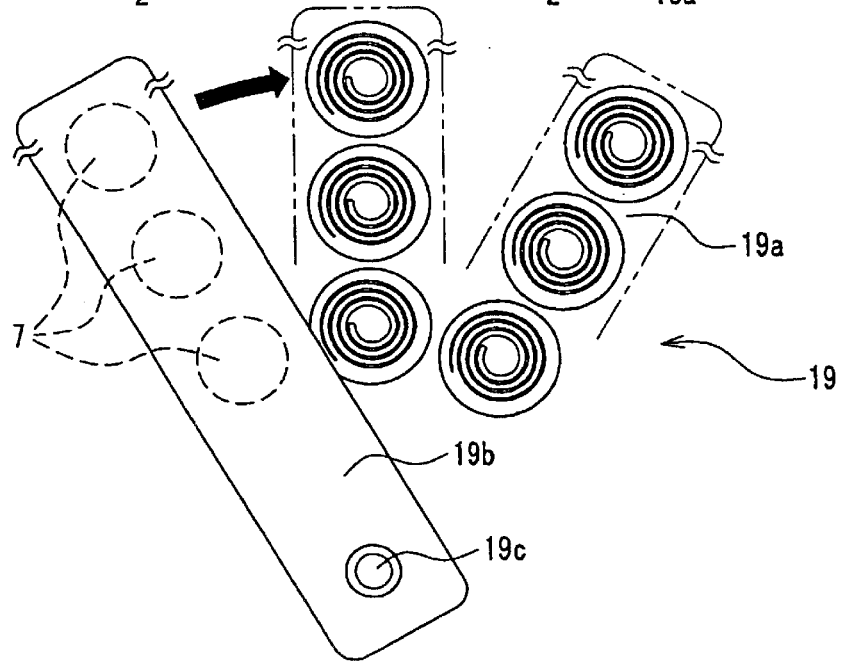

FIGS. 8A to 8C are drawings exemplifying an application of spiral contactors of the invention to switches of electronic components and the like.

As shown in FIG. 8A, a switch 18 is constituted of female switches 18a and a male switch 18b.

At the switches 18a are provided spiral-shaped terminals 18c having the same constitution as the spiral-shaped terminal described before, and the terminals 18c are connected with a power source not shown in the drawings.

At the switch 18b are provided connection end terminals 7, for example, the spherical connection end terminals, connected with electronic components (electronic appliances) not shown in the drawings.

Thus, if the switch 18b is moved in FIG. 8A in a direction shown by arrow marks, the connection end terminals 7 provided at the switch 18b and the spiral-shaped terminals 18c are contacted, and the power source and electronic components not shown in the drawing are connected. That is, the switches become a turned-on state, thereby power resulting in being supplied to the electronic components (electronic compliances).

As described before, the spiral contactors related to the invention are made utilizing a minuscule processing technology, so a switch made by utilizing the spiral contactors related to the invention can be made a thinner and miniaturized type of switch.

For example, as shown in FIG. 8B, a total thickness t of a thickness 2t of the male switch 18b and a thickness t1 of the female switch 18a can be made thinner than a thickness of a credit card (0.7 mm).

Thus, the spiral contactors related to the invention can also be favorably used as a switch for various kinds of nanodevices.

Meanwhile, not only a constitution which makes an ON/OFF of a switch possible by a horizontal movement, but also, as shown in FIG. 8C, another constitution which makes a female switch 19a and a male switch 19b rotate around a center of a fulcrum 19c are possible.

[Fifth Embodiment]

Figure 9A:
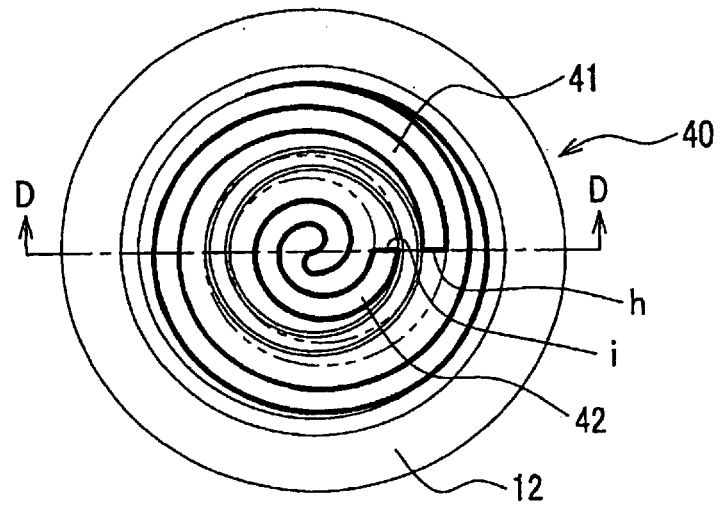
FIG. 9A is a drawing showing another example in which a spiral-shaped terminal related to the invention is utilized as a switch of an electronic component and the like, and is a plan view of the spiral-shaped terminal of an arrow view E shown in FIG. 9B.
Figure 9B:
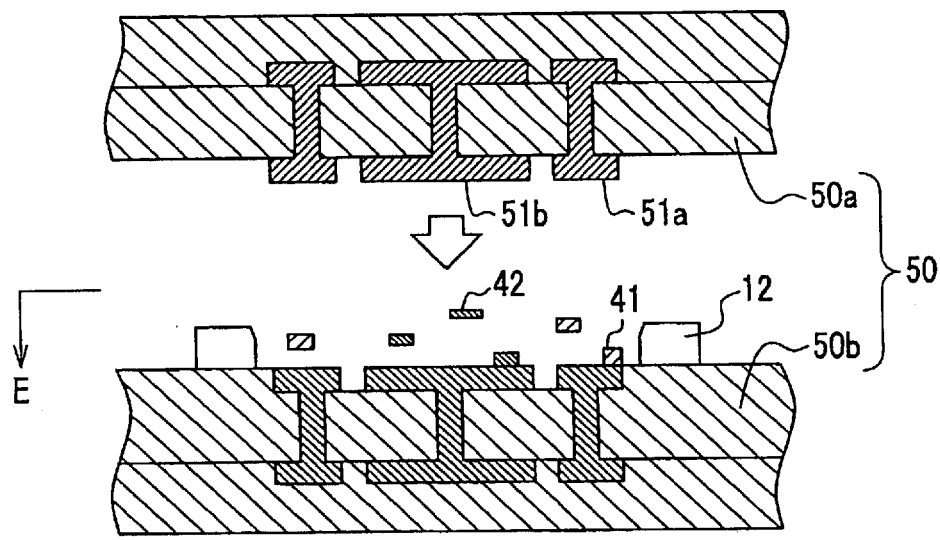
FIG. 9B is a section drawing of a line D—D.
Figure 9C:
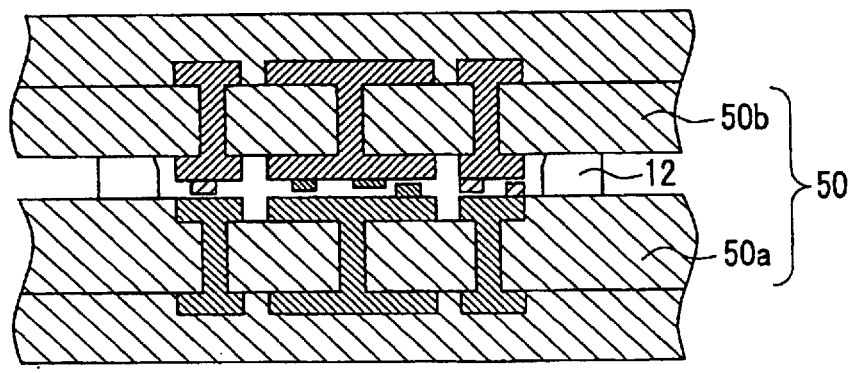
FIG. 9C is a section drawing showing a connected state.
Figure 10A:
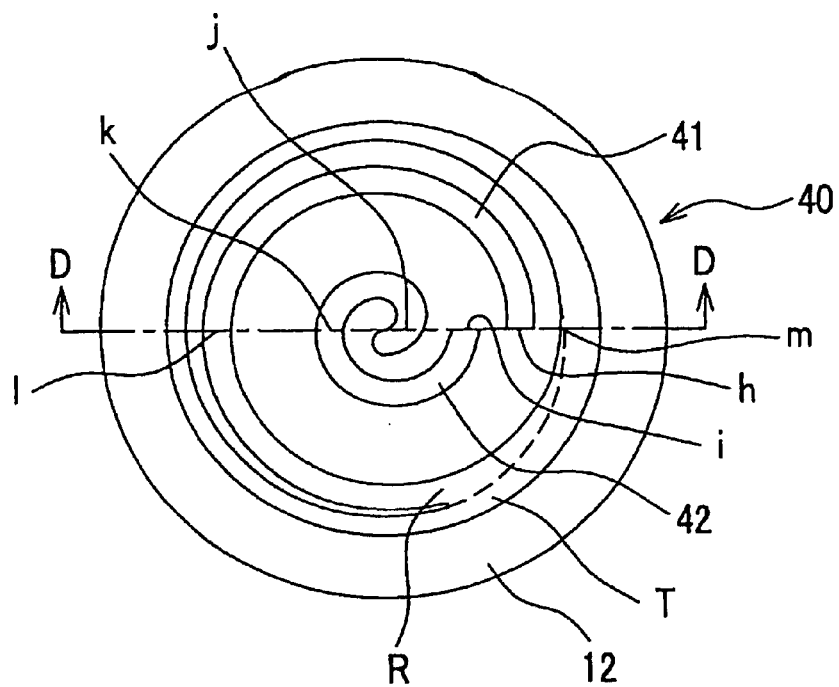
FIG. 10A is a drawing schematically representing FIG. 9A.
Figure 10B:
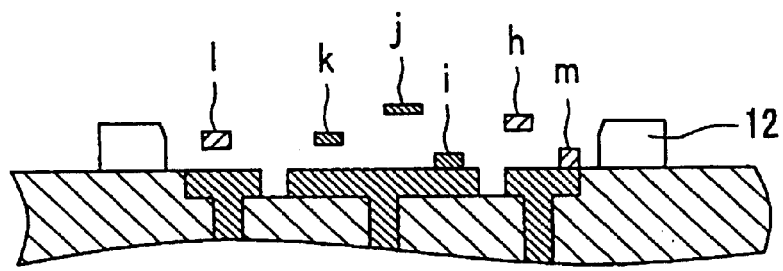
FIG. 10B is a section drawing of a line D—D of FIG. 10A.
Figures 11A, 11B:
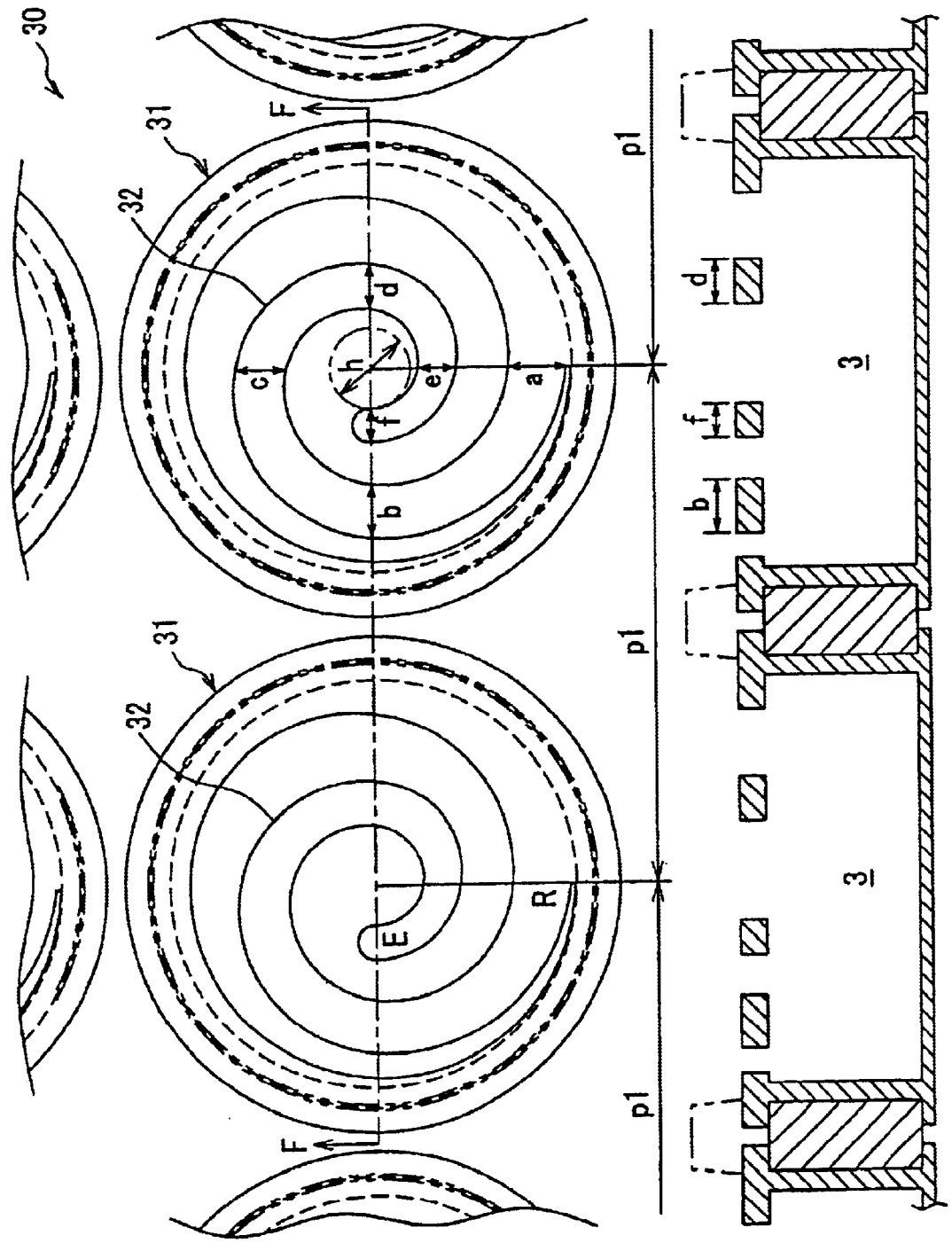
FIG. 11A is an enlarged drawing of a conventional spiral contactor.
FIG. 11B is a section drawing of a line F—F shown in FIG. 11A.
Figure 12A:
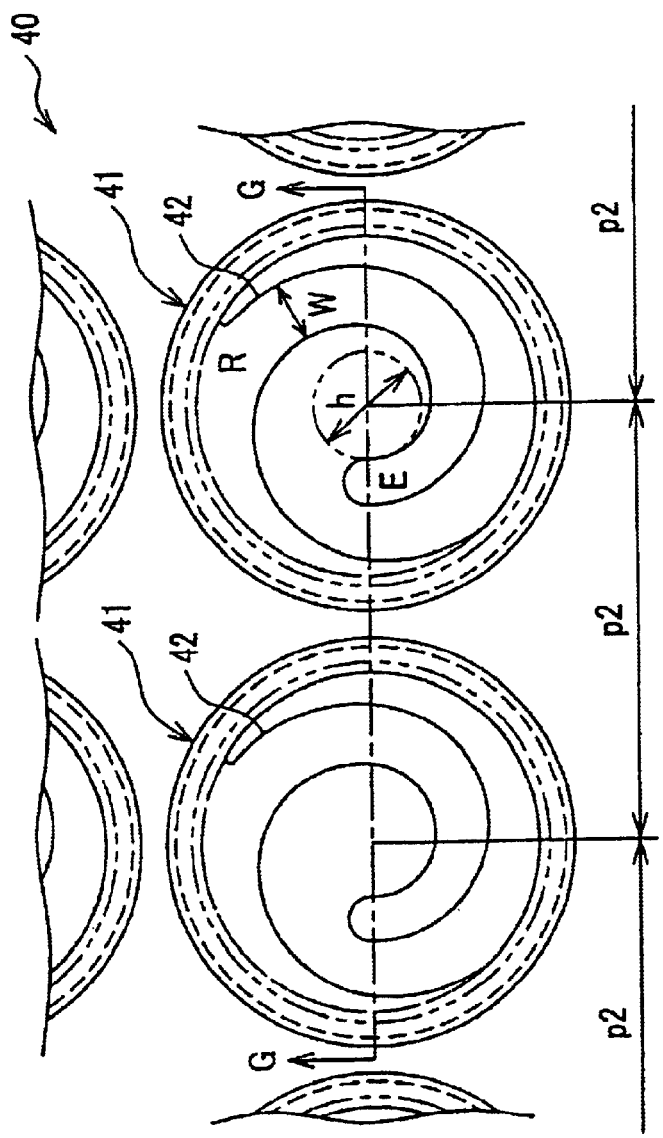
FIGS. 12A and 12B show a conventional spiral contactor.
Figure 12B:
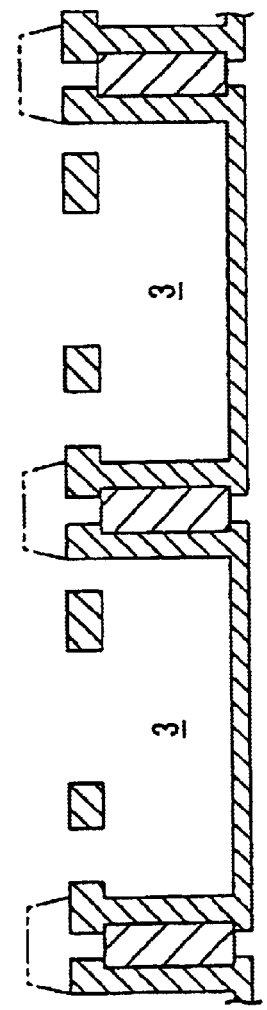

FIGS. 9A to 9C are drawings showing other examples in which the spiral contactors related to the invention are applied to switches 50 of electronic components and the like. And FIG. 10A is a drawing schematically representing FIG. 9A; FIG. 10B is a schematic section drawing of a line D—D of FIG. 10A.

As shown FIG. 9B, the switch 50 is constituted of a male switch 50a and female switch 50b.

At the male switch 50a are provided connection end terminals 51a and 51b not electrically connected.

At the female switch 50b is provided a spiral-shaped terminal 40. In the spiral-shaped terminal 40 exist two things corresponding to the contact portion 1' of the spiral-shaped terminal 1. That is, in the spiral-shaped terminal 40 are provided terminals 41 and 42 (see FIGS. 10A and 10B).

The terminal 41 as the contact portion 1' has a spiral shape and its thickness is set to become thinner as the contact portion 1' proceeds to a top side.

A base end R of the terminal 41 is fixed on a peripheral frame T of the spiral-shaped terminal 40 and the terminal 41 is provided in a state spirally extended upward from the base end R which is a connection point with the frame T. That is, as shown in FIG. 10B, in the terminal 41 a point m is positioned lowest, and from there as a point proceeds toward points l and h, they are designed to be gradually positioned upward.

In addition, the terminal 42 is fixed on a board at its end and provided in a state spirally extended upward from its end i. That is, as shown in FIG. 10B, in the terminal 42 a point i is positioned lowest, and from there as a point proceeds toward points k and j, they are designed to be gradually positioned upward.

That is, in the spiral-shaped terminal 40 are provided total two terminals, the terminal 42 with a larger spiral radius and the terminal 41 with a smaller spiral radius. And if pushed from an upside by contact end terminals 51a and 51b, the terminals 40 and 41 are constituted so as to be able to move toward downside.

Because such the constituted switch 50 adopts an extremely small contactor in which two electrical paths exist, it can also be favorably utilized as a switch for various kinds of nanodevices and an inspection needle portion of an inspection apparatus of a semiconductor chip.

Meanwhile, the invention can be variously remodeled and changed in the range of its technical ideas. The invention is characterized in that the minuscule processing is dispensed by the photolithography technology and plating manufacturing technology, and therefore, it is natural that the invention covers manufacturing methods using these.

INDUSTRIAL APPLICABILITY

According to the terminals related to the present invention, electrical connections with electronic components are ensured by surely contacting connection end terminals of various kinds of electronic components in which a microminiaturization is proceeding.

Moreover, in the spiral contactors with the terminals because the terminals can be plurally provided on boards with an accurate and extremely small size by the lithography technology, they are favorably applicable to various kinds of microdevices in which an ultra-thinning is proceeding.

What is claimed is:

1. A terminal for a spiral contactor which performs an electrical connection with a connection end terminal provided in an electronic component, the terminal comprising:

a peripheral frame, and a contact portion contacting said end terminal;

wherein one end of said contact portion is fixed on said peripheral frame, and the other end of said contact portion is provided spirally extended toward a center of an opening of said peripheral frame so as to universally move in a perpendicular direction for an opening face of said peripheral frame; and wherein a thickness of said contact portion becomes thinner as the contact portion proceeds from said one end toward said other end.

2. A terminal for a spiral contactor according to claim 1, wherein a metal film is formed on a surface of said contact portion with plating.

3. A spiral contactor equipped with a terminal for a spiral contactor according to claim 1 in a board;

wherein said terminal is embedded in said board so that said contact portion becomes same in level with a surface of said board; and wherein a concave portion tolerating a movement of said contact portion inside said board is provided.

4. A spiral contactor according to claim 3, wherein terminals equal to connection end terminals in number provided in said electronic component are provided, and wherein respective said terminals are disposed on said board so as to correspond to respective said connection end terminals one for one.

5. A spiral contactor equipped with a terminal for a spiral contactor according to claim 1 on a board;

wherein said terminal is provided on said board so that said contact portion is separated from a surface of said board as said terminal proceeds from said one end toward said the other end of said contact portion.

6. A spiral contactor according to claim 5, wherein terminals equal to connection end terminals in number provided in said electronic component are provided, and wherein respective said terminals are disposed on said board so as to correspond to respective said connection end terminals one for one.

* * * * *